United States Patent [19]
Drenten et al.

[11] Patent Number: 5,610,760
[45] Date of Patent: Mar. 11, 1997

[54] DEVICE FOR RAISING THE FREQUENCY OF ELECTROMAGNETIC RADIATION

[75] Inventors: Ronald R. Drenten; Michiel J. Jongerius; Richard B. J. Droste, all of Eindhoven, Netherlands

[73] Assignee: U.S. Philips Corporation, New York, N.Y.

[21] Appl. No.: 402,583

[22] Filed: Mar. 13, 1995

[30] Foreign Application Priority Data

Mar. 11, 1994 [EP] European Pat. Off. .............. 94200636

[51] Int. Cl.$^6$ ...................................... G02F 1/37
[52] U.S. Cl. .................... 359/332; 359/328; 385/122
[58] Field of Search ..................... 359/326–332; 385/122; 372/21, 22

[56] References Cited

U.S. PATENT DOCUMENTS

| | | | |
|---|---|---|---|
| 4,924,079 | 5/1990 | Opheij et al. | 250/201.5 |
| 5,022,730 | 6/1991 | Cimini et al. | 385/122 X |
| 5,157,754 | 10/1992 | Bierlein et al. | 385/122 |
| 5,185,752 | 2/1993 | Welch et al. | 372/22 |
| 5,218,661 | 6/1993 | Droste et al. | 385/122 |
| 5,237,636 | 8/1993 | Harada | 385/122 |
| 5,301,059 | 4/1994 | Kitaoka et al. | 359/332 |
| 5,387,998 | 2/1995 | Kitaoka et al. | 359/328 |

FOREIGN PATENT DOCUMENTS

| | | | |
|---|---|---|---|
| 0592226A1 | 4/1994 | European Pat. Off. | G02F 1/37 |
| 4-224063 | 3/1994 | Japan | G02F 1/37 |

OTHER PUBLICATIONS

"Het Systeem Compact Disc Digitail Audio" by M. G. Carasso, J. B. H. Peek and J. P. Sinjou in Philips Technisch Tijdschrift 40, pp. 267–272, 1981–82. No. 9 [No Month].

"Stable blue second–harmonic generation in a KTP waveguide with a diode laser in an external cavity" by F. Laurell in Electronics Letters, Sep. 1993, vol. 29, No. 18, pp. 1629–1630.

"Blue second harmonic generation in KTP, LiNbO$_3$ and LiTaO$_3$ waveguides" by M. J. Jongerius, R. R. Drenten and R. B. J. Droste in Philips Journal of Research, vol. 46, pp. 231–265, 1992 [No Month].

*Primary Examiner*—John D. Lee

[57] ABSTRACT

Device (1) for raising the frequency of electromagnetic radiation. The device (1) comprises a diode laser (3) for generating the radiation, and a non-linear optical medium (11) in which a first optical waveguide (9) is arranged for guiding a fundamental wave of the diode laser radiation while forming a higher harmonic wave. Moreover, the device (1) comprises a wavelength stabilizer (5) for stabilizing the wavelength of the fundamental wave. The wavelength stabilizer (5) is constituted by a second optical waveguide (13) with a refractive index grating extending in its longitudinal direction and whose selection wavelength is electrically controllable by means of an electrode structure (15; 29).

35 Claims, 9 Drawing Sheets

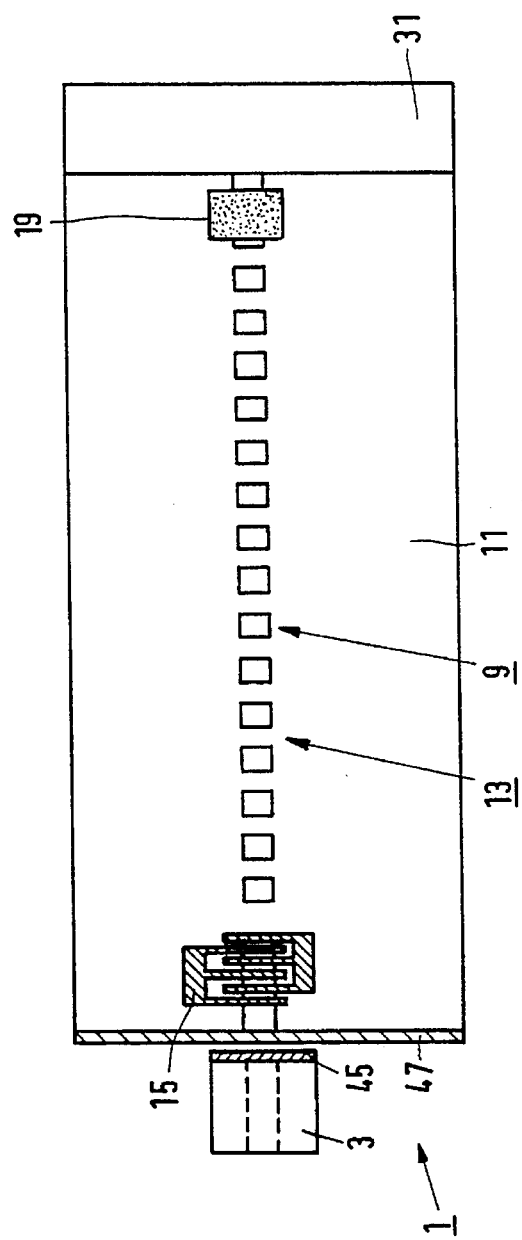
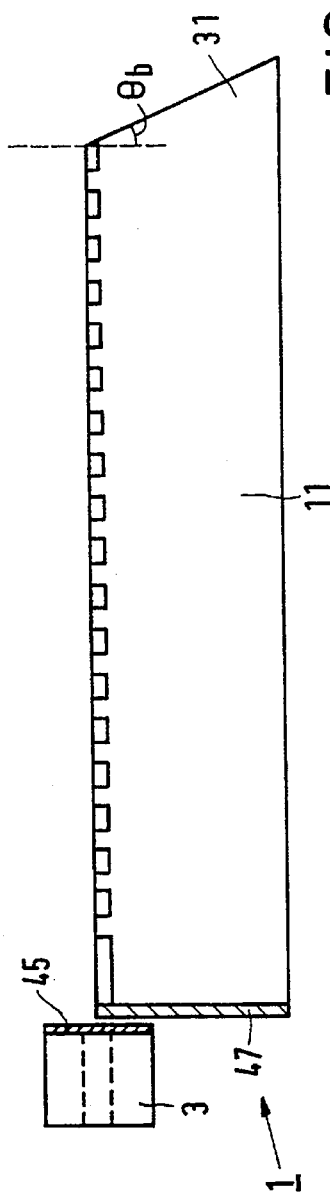

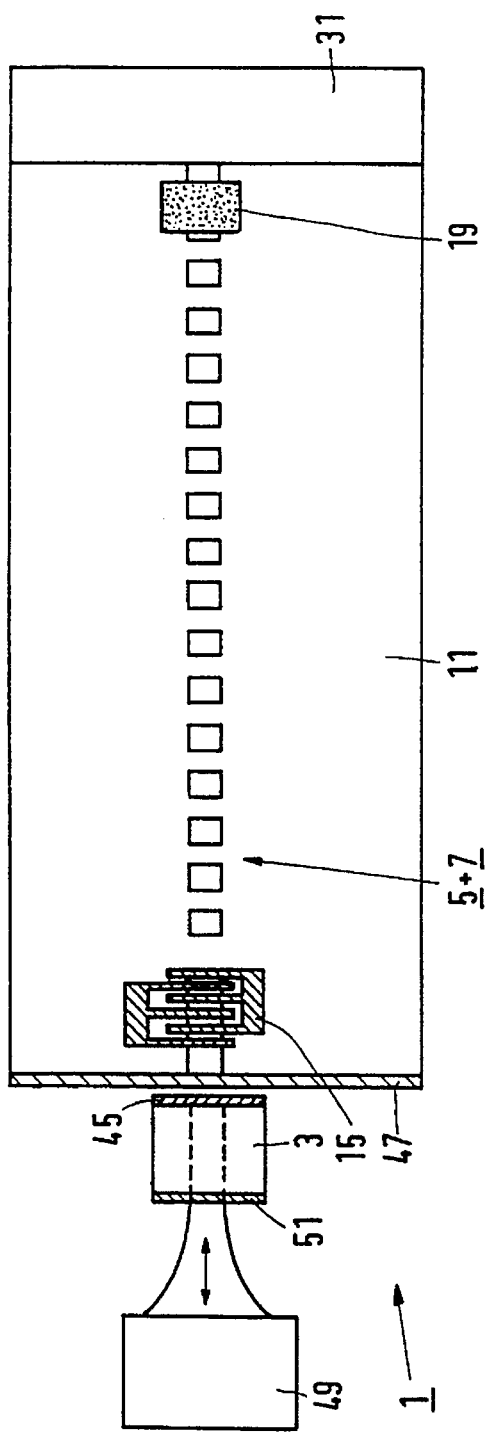
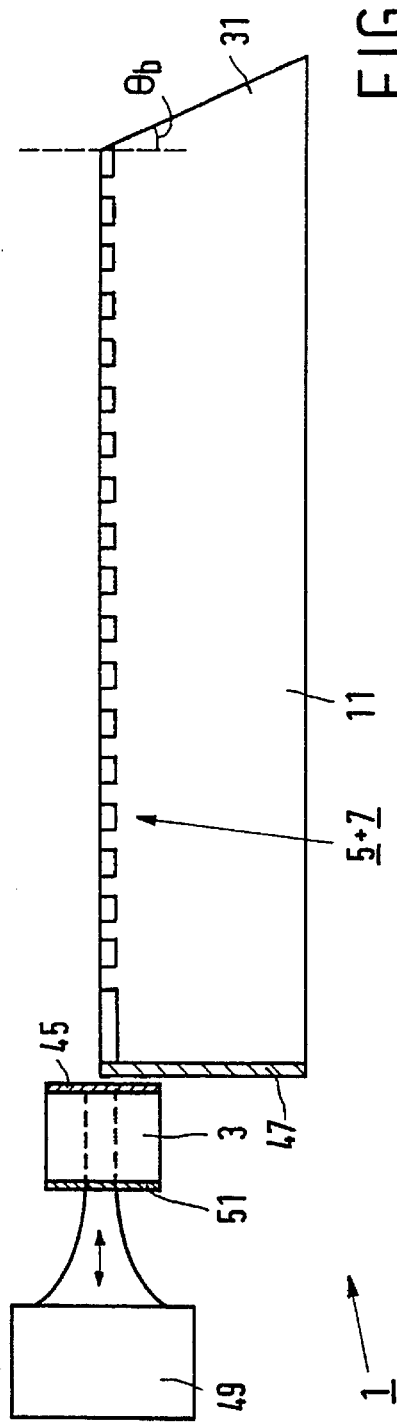

DEVICE FOR RAISING THE FREQUENCY OF ELECTROMAGNETIC RADIATION

BACKGROUND OF THE INVENTION

1. Field of the Invention

The invention relates to a device for raising the frequency of electromagnetic radiation, comprising a diode laser for generating the radiation, a non-linear optical medium having a first optical waveguide for guiding a fundamental wave of the diode laser radiation while forming a second harmonic wave, and a wavelength stabilizer for stabilizing the wavelength of the fundamental wave.

The invention also relates to an optical scanning device comprising such a device.

2. Discussion of the Related Art

A device for raising the frequency of electromagnetic radiation of the type described in the opening paragraph is known from the article "Stable blue second-harmonic generation in a KTP waveguide with a diode laser in an external cavity" by F. Laurell in Electronics Letters, September 1993, vol. 29, no. 18, pp. 1629–1630.

Since most non-linear optical materials used for raising the frequency have, however, a relatively small acceptance bandwidth imposing relatively stringent requirements on the diode laser, a relatively small number of diode lasers is readily suitable for this application. Acceptance bandwidth is understood to mean the width of the wavelength band, around a nominal wavelength, of the radiation which is efficiently raised in frequency by the non-linear optical material. The paramount requirements imposed on diode lasers for such applications are:

1) the wavelength band of the radiation emitted by the diode laser should be within the acceptance bandwidth of the non-linear optical material. This requirement limits the number of usable lasers;
2) the emission wavelength of the diode laser should be very stable with respect to the acceptance bandwidth, so that this wavelength is always within the acceptance bandwidth of the non-linear optical material.

In the device described in said article the wavelength of the diode laser is stabilized at a given value by means of an external resonant cavity which is provided with a grating. By varying the orientation of the grating, a different wavelength will be fed back to the diode laser. In this way the wavelength of the diode laser can be adapted to the wavelength at which phase matching occurs in the non-linear optical material.

A drawback of the known device is, however, that the variation of the orientation of the grating is to be effected in a relatively accurate way, because the difference in effective refractive index between the situations where there is phase matching and where there is no phase matching is relatively small. Moreover, the orientation of the grating is varied mechanically, which is a relatively slow process as compared with an electrically controlled variation. To achieve a sufficiently high spectral resolution, the grating (for example, a standard grating having 600 lines/mm) should have a diameter of the order of 5 mm, which limits the compactness of the device.

SUMMARY OF THE INVENTION

It is an object of the invention to provide a device for raising the frequency of electromagnetic radiation, in which the fundamental wavelength can be stabilized at a value which is also adapted to the wavelength at which the frequency is efficiently raised for the non-linear optical material, in other words in which there is phase matching between the fundamental wave and the frequency-raised wave. Such a device can be used to great advantage in, inter alia optical recording systems in which a scanning beam having a short wavelength is desired for obtaining a high information density on the record carrier.

To this end the device according to the invention is characterized in that the wavelength stabilizer is constituted by a second optical waveguide in a medium comprising a refractive index grating which extends in the longitudinal direction of the second optical waveguide, and an electrode structure by means of which the selection wavelength of the refractive index grating is electrically controllable.

A refractive index grating is understood to mean a succession of domains across which the refractive index varies periodically.

Since the selection wavelength of the refractive index grating can be varied, the wavelength of the fundamental wave of the diode laser can be adapted to the wavelength at which the frequency is raised efficiently in the non-linear optical material. Moreover, it is possible to compensate for variations of the wavelength of the diode laser and of the acceptance band of the non-linear material due to temperature fluctuations. Both the wavelength at which the frequency is raised and the diode laser wavelength are actually very much dependent on temperature so that a considerable improvement in the efficiency of raising the frequency can be realised by means of the wavelength stabilization described. The stabilizer section thus ensures that the wavelength of the fundamental wave of the diode laser is within the acceptance band of the non-linear optical material within a larger temperature range and for acceptable manufacturing tolerances of the frequency-raising section.

A preferred embodiment of the device according to the invention is characterized in that the waveguides in which the frequency is raised and in which the wavelength is stabilized are integrated in the same non-linear optical medium.

By integrating the stabilizer section and the frequency-raising section in the same medium, the number of separate components is reduced considerably and the device can be given a compact structure.

A further embodiment of the device according to the invention is characterized in that the electrode structure forms part of an electro-acoustic converter for generating a surface-acoustic wave in the second optical waveguide by means of which a refractive index grating having a variable period can be induced.

By means of the acoustic wave, a periodical refractive index variation is provided in the material in which the stabilizer section is present. The acoustic wave varies the refractive index of this material in such a way that a part of the radiation emitted by the diode laser returns at a well-defined wavelength from the waveguide to the diode laser. In other words, there is feedback between the waves emitted by the diode laser and the ultimately returning waves. In fact, a refractive index grating is induced which serves as a wavelength-selective mirror. Consequently, the wavelength of the fundamental wave can be fixed at a given value. By varying the wavelength of the acoustic wave, the period of the refractive index grating and hence the wavelength of the fundamental wave can be varied.

An alternative embodiment of the device according to the invention is characterized in that the refractive index grating is constituted by a relief grating and in that the electrode structure comprises two facing electrically conducting electrodes which enclose the relief grating and between which an electric field can be applied.

A further embodiment of the device according to the invention is characterized in that the refractive index grating is a segmented channel structure and in that the electrode structure comprises two facing electrically conducting electrodes which enclose the channel structure and between which an electric field can be applied.

Both embodiments utilize the electro-optical effect at which the average refractive index of the waveguide in the stabilizer section and hence the operation of the permanent grating present therein and hence the wavelength of the fundamental wave supplied by the diode laser can be varied by variation of the applied voltage between the electrodes. Irrespective of the axis along which the non-linear optical material is cut, the electric field is preferably applied parallel to the optical z-axis of the crystal. To this end the electrodes should be provided in a different position with respect to the waveguide, dependent on the orientation of the crystal.

In order that the acoustic wave does not enter the waveguide in which the frequency is raised, so that the average refractive index of the frequency-raising section might change in such a way that the frequency is not raised or the frequency is raised less efficiently, the device according to the invention is characterized in that the first optical waveguide and the second optical waveguide are in alignment with each other, while for the refractive index grating induced by means of an acoustic wave, means are provided between the two waveguides, which means prevent propagation of the acoustic wave in the waveguide in which the frequency is raised.

The sequence in which the waveguides join one another is not important. Both the stabilizer section and the frequency-doubling section may be the waveguide into which the diode laser radiation is coupled in.

A first modification of this embodiment of the device according to the invention is characterized in that the means is a bend formed between the two waveguides.

A second modification of this embodiment of the device according to the invention is characterized in that the means is an element reflecting or absorbing the acoustic wave.

In said embodiments in which the refractive index grating is induced by means of an acoustic wave, the acoustic wave should have a relatively high frequency, for example several GHz. A wave having such a high frequency may be subject to attenuation. Moreover, for obtaining the high-frequency acoustic wave the higher tones of the transducer resonance will have to be used, which is accompanied by a lower electric-acoustic conversion than in the case where the fundamental tone of the transducer resonance can be used. Both aspects cause a relatively low efficiency.

An embodiment of the device according to the invention, in which an acoustic wave with a lower frequency can be used, is characterized in that the first optical waveguide and the second optical waveguide are juxtaposed in the same non-linear optical medium and have different widths, each of the two waveguides having a section in a coupling area where the acoustic wave can be induced, said sections being located so close together that propagating radiation in the waveguides in the coupling area can be transferred between these two sections at a given frequency of the acoustic wave, while the diode laser is coupled in at the entrance face of the first waveguide and a reflecting element is present at the exit face of the second waveguide.

In this embodiment the wave, a portion of which is transferred to the other waveguide, and the transferred wave propagate in the same direction. This means that only a small difference in propagation constant should be bridged so that it is sufficient to use a refractive index grating having a larger period and hence an acoustic wave having a lower frequency.

The two waveguides have different widths in order that feedback should only occur at a given frequency of the acoustic wave. In fact, at equal widths there is feedback between the two waveguides without the necessity of inducing an acoustic wave and consequently there is no wavelength selection.

A further embodiment of the device according to the invention is characterized in that the first waveguide constitutes the frequency-raising section.

In this way the device can be given a considerably more compact structure.

Another embodiment of the device according to the invention, in which an acoustic wave with a lower frequency can be used, is characterized in that the first waveguide and the second waveguide at least partly coincide, the exit face of the optical waveguide facing away from the diode laser being provided with an at least partial reflector which reflects the linear polarization mode perpendicular to the linear polarization mode suitable for frequency doubling towards the diode laser and passes the polarization mode suitable for frequency doubling.

Since the first and the second waveguides at least partly coincide, the device can be given an even more compact structure. Moreover, losses of the laser light, which occur before it can be raised in frequency, are limited in this way.

The linear polarization mode suitable for frequency doubling is determined by the non-linear optical material used for frequency doubling. For example, for KTP the polarization mode suitable for frequency doubling is the TM mode.

Due to the presence of the acoustic wave, TE-polarized radiation is converted into TM-polarized radiation, and conversely. When the two directions of polarization are reflected towards the diode laser, the diode laser will consequently also emit radiation which cannot contribute to the frequency doubling, which results in a limitation of the efficiency of the device.

A further embodiment of the device according to the invention is characterized in that the reflecting element is implemented as an exit face ground at a Brewster angle of the waveguide facing away from the diode laser.

Dependent on whether the linear polarization mode to be reflected towards the diode laser is the TE mode or the TM mode, the Brewster angle exit face should be ground with respect to the normal on the surface of the device or with respect to the normal on the side face of the device.

An exit face ground at a Brewster angle and used as a reflecting element can be realised in a relatively simple manner and prevents the problems which may occur in the alignment of a separate component as a reflecting element.

A further embodiment of the device according to the invention is characterized in that polarization means are provided between the diode laser and the subsequent waveguide, which means substantially only pass the linear polarization mode, suitable for frequency doubling, of the radiation emitted by the diode laser.

In this way, the unwanted polarization mode is prevented from propagating in the waveguides and from returning to the diode laser due to reflection on the exit face of the waveguide facing away from the diode laser, so that the diode laser would emit more radiation in the unwanted linear polarization mode.

A further embodiment of the device according to the invention is characterized in that an extra waveguide having a length L' is arranged between the diode laser and the wavelength stabilizer, where $L'>>\lambda_o^2/2n\Delta\lambda_{pm}$, with $\Delta\lambda_{pm}$ being the acceptance bandwidth for raising the frequency, n being the refractive index of the waveguide and $\lambda_o$ being the wavelength of the fundamental wave of the diode laser.

By extending the resonant cavity of the diode laser with a passive waveguide having a length L' satisfying said condition, it is possible to reduce the distance between the modi of the diode laser, so that the possibility of adapting the wavelength of the fundamental wave to a wavelength within the acceptance bandwidth of the non-linear optical material increases considerably.

The device according to the invention is preferably characterized in that the exit face of the diode laser has an anti-reflecting coating.

By providing the exit face of the diode laser with an anti-reflecting coating, the diode laser is prevented from supplying radiation at a wavelength which suits the length of the diode laser itself instead of the wavelength which is imposed by the external wavelength-selective mirror.

A further embodiment of the device according to the invention is characterized in that the entrance face of the waveguide has an anti-reflecting coating.

By providing also the entrance face of the waveguide with an anti-reflecting coating, a better coupling of the diode laser radiation into the waveguide is obtained in addition to preventing unwanted reflections.

To prevent unwanted reflections on the exit face of the waveguide, the device according to the invention is characterized in that the exit face of the waveguide has an anti-reflecting coating.

A further embodiment of the device according to the invention is characterized in that the non-linear optical medium is a KTP crystal.

KTP is a very suitable material for use in the device described.

BRIEF DESCRIPTION OF THE DRAWINGS

These and other aspects of the invention will be apparent from and elucidated with reference to the embodiments described hereinafter.

In the drawings;

FIGS. 10(a) to 10(f) are plan views (a, c, e) and side elevational views (b, d, f) of three embodiments of a device for raising the frequency according to the invention, in which the frequency-raising waveguide and the refractive index grating coincide.

DETAILED DESCRIPTION OF THE PREFERRED EMBODIMENTS

The invention will be explained with reference to frequency doubling. However, the invention need not be limited to second harmonic generation, but may also be used for higher harmonic generation, provided that a suitable choice of material and frequency of the surface acoustic wave or the strength of the electric field is made.

Figure 1:
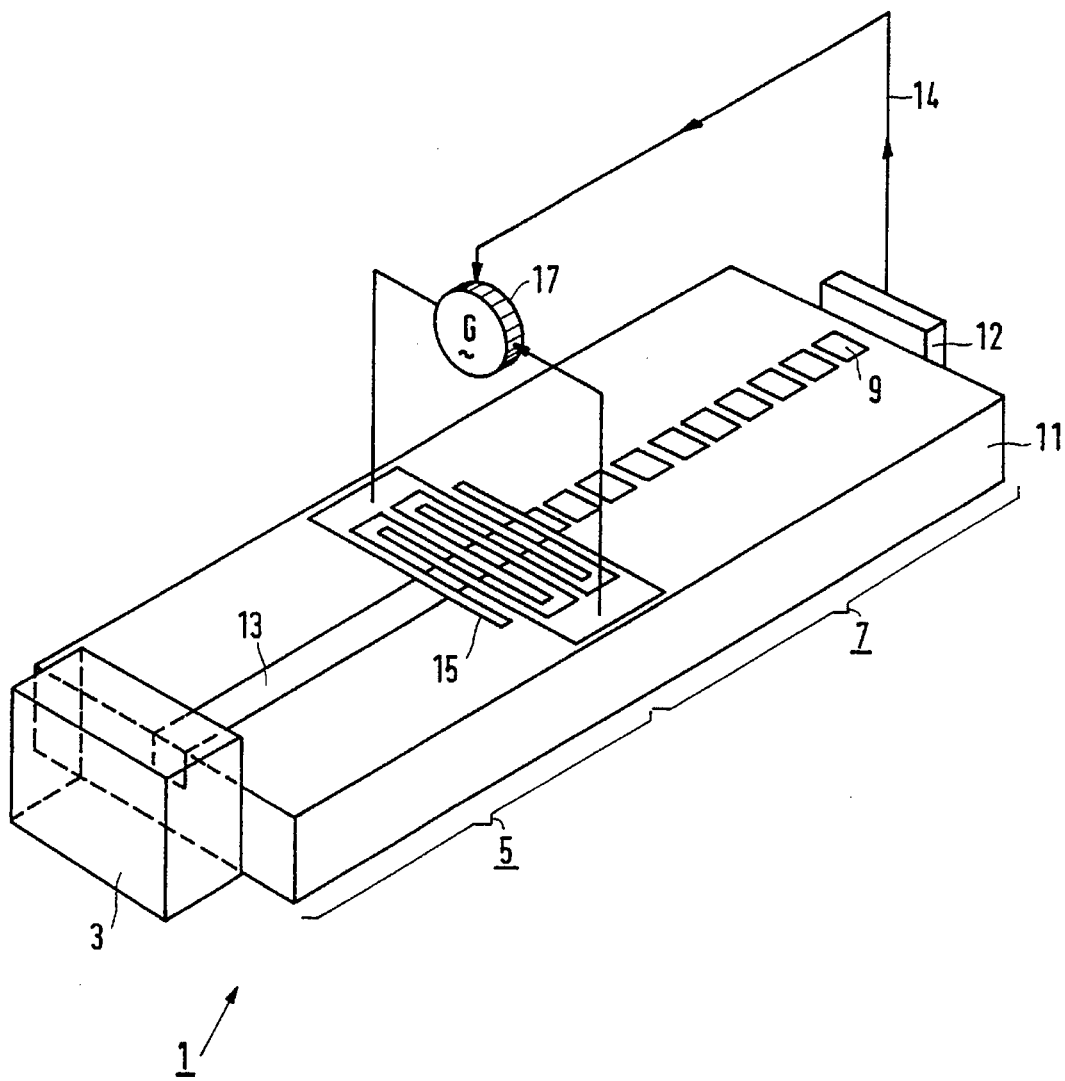
FIG. 1 is a perspective elevational view of an embodiment of a device for raising the frequency according to the invention, in which the refractive index grating is generated by means of an acoustic wave.

The device 1 shown in a perspective elevational view in FIG. 1 comprises a diode laser 3 for supplying the electromagnetic radiation to be doubled in frequency and having a fundamental wavelength, a stabilizer section 5 for stabilizing the wavelength of the fundamental wave of the diode laser 3 at a given value, and a frequency-doubling section 7.

The frequency-doubling section 7 comprises a waveguide 9 of non-linear optical material 11. In this waveguide 9 the frequency is doubled on condition that the wavelength of the fundamental wave of the diode laser 3 is within the acceptance band of the non-linear optical material. In fact, the phase of the second harmonic wave is then matched with the phase of the fundamental wave so that second harmonic sub-waves generated at different positions along the waveguide interfere with each other in a constructive way and a sufficiently large amount of second harmonic radiation is obtained. To ensure that the fundamental wavelength is and remains within the acceptance band of the non-linear optical medium, even when varying the ambient parameters, the present invention proposes to provide the device 1 with an adjustable wavelength stabilizer 5. The wavelength stabilizer 5 thus ensures that the wavelength of the fundamental wave is adapted to the acceptance band of the non-linear optical material. This means that the diode laser 3 can be adjusted at a wavelength for which the frequency is efficiently doubled. The stabilizer functions as a new, adjustable diode laser mirror which is now wavelength-selective.

Both the frequency-doubling section 7 and the wavelength stabilizer 5 can be implemented and combined in different manners.

The frequency-doubling section 7 may be a segmented waveguide which is arranged in the non-linear optical material, for example by means of proton exchange or proton implantation as described for the materials $LiNbO_3$ and $LiTaO_3$ in U.S. Pat. No. 5,218,661. In this way periodical domains are provided in the waveguide with a lower second-order susceptibility and a higher refractive index with respect to the non-linear optical material. For materials such as $KTiOPO_4$ (KTP) and KTP-like materials such as $MTiOXO_4$ in which M is partly K, Rb, Tl, $NH_4$ or Cs and X is partly P or As, reference is made to U.S. Pat. No. 5,157,754. For the description of the method of providing waveguides in the above-mentioned materials, further reference is made to the article "Blue second harmonic generation in KTP, $LiNbO_3$ and $LiTaO_3$ waveguides" by M. J. Jongerius, R. R. Drenten and R. B. J. Droste in Philips Journal of Research, vol. 46, pp. 231–265, 1992.

The wavelength stabilizer 5 can be implemented as a refractive index grating in a second optical waveguide. Such a refractive index grating may also be realised in different manners.

A first manner is to induce a surface-acoustic wave in a waveguide 13 terminating on the waveguide 9 in which there is frequency doubling, which surface-acoustic wave is induced by means of, for example a vapour-deposited or sputtered metal electrode structure 15 which is connected to a high-frequency AC generator 17. Its frequency is typically of the order of several GHz. This structure 15 constitutes a part of an electro-acoustic converter and will be further referred to as transducer. The waveguide 13 in which the acoustic wave is to be generated, may be obtained, for example by means of proton exchange. In the longitudinal direction of this waveguide, the acoustic wave produces a succession of domains across which the refractive index varies periodically. The acoustic wave thus induces a refractive index grating with a pitch $\Lambda$ whose value is determined by the frequency of the acoustic wave. This grating reflects only radiation having a well-defined wavelength, which means that one of the mirrors of the diode laser is replaced by a DBR (Distributed Bragg Reflector). The diode laser 3 is thereby forced to generate radiation at a wavelength which is substantially equal to the reflection wavelength of the DBR mirror. By varying the frequency of the acoustic wave, the reflection wavelength of this DBR mirror can be varied, because a variation of the acoustic wave frequency involves a variation of the pitch $\Lambda$ of the refractive index grating. According to the invention, the frequency of the acoustic wave is chosen to be such that the wavelength of the fundamental wave falls within the acceptance bandwidth of the non-linear optical material of the frequency doubler 9. The refractive index modulation thus realised is typically of the order of $10^3$. The refractive index grating acts as a wavelength-selective mirror.

Figure 2:
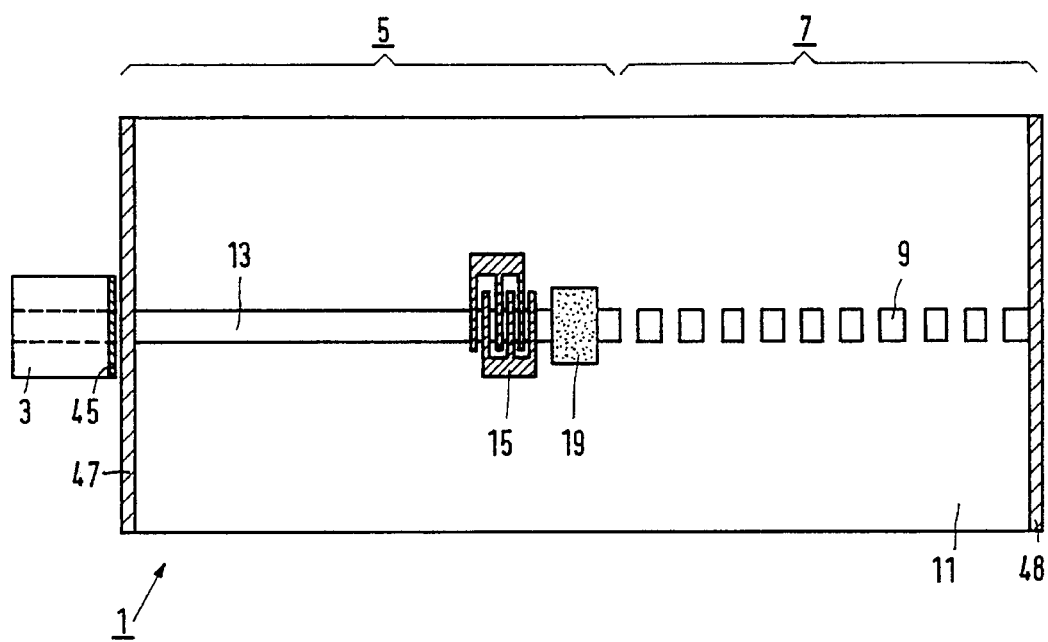
FIGS. 2 to 5 are plan views of a number of embodiments of a device for raising the frequency according to the invention, in which the wavelength stabilization is realised in an acousto-optical manner.

The wavelength stabilizer 5 and the frequency doubler 7 may be constituted by discrete elements made of the same or different material. However, these elements are preferably integrated in one waveguiding structure in the same non-linear optical material, as is shown in FIG. 1. In this way the number of separate components is limited. The two waveguides 13 and 9 may adjoin each other. To prevent the surface-acoustic wave from penetrating the frequency-doubling waveguide 9 in this case, so that the average refractive index in the waveguide 9 is influenced and efficient frequency doubling will occur, extra measures will have to be taken. A first manner of stopping the acoustic wave is to provide an element 19 reflecting or absorbing the acoustic wave between the waveguide 13 of the stabilizer section 5 and the waveguide 9 of the frequency doubling section 7, as is shown in FIG. 2. Such an element may be, for example a block of epoxy to which, for example silver or silica has been added which is provided on top of the medium in which the surface-acoustic wave propagates.

Figure 3:
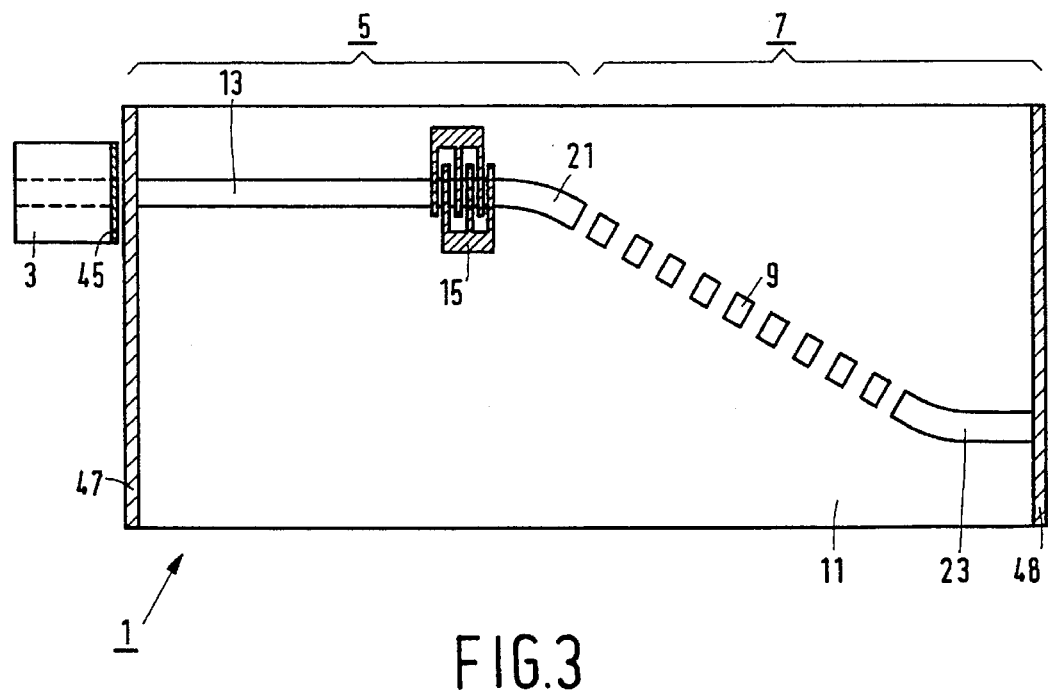

Another way of preventing the acoustic wave from penetrating the frequency-doubling waveguide 9 is shown in FIG. 3 and consists in providing a bend 21 between the two waveguides 9 and 13. The second bend 23 is provided for the sake of geometry.

Figure 4:
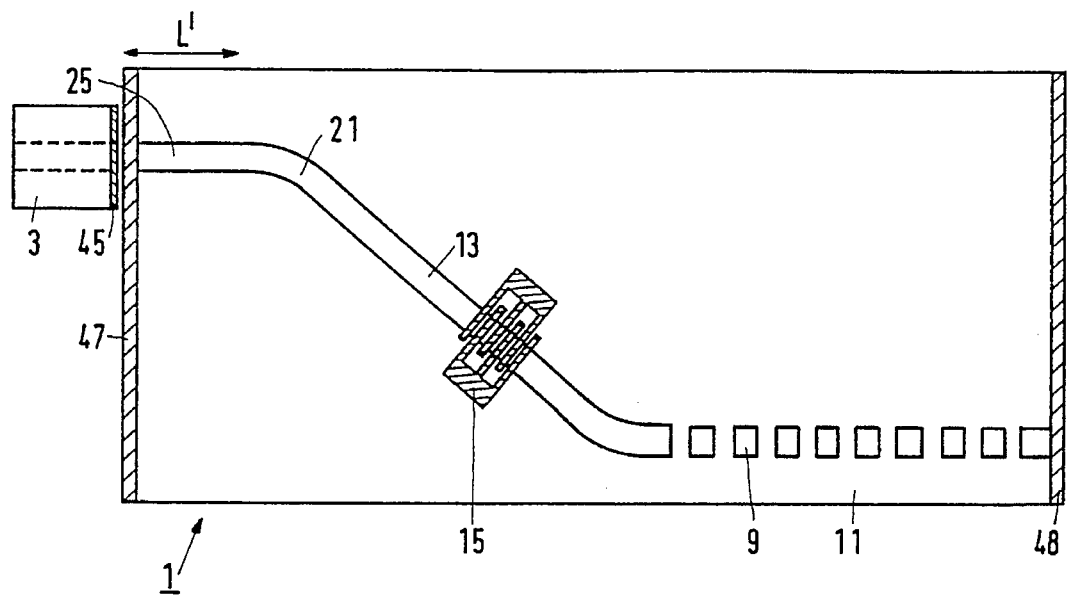
Figure 5:
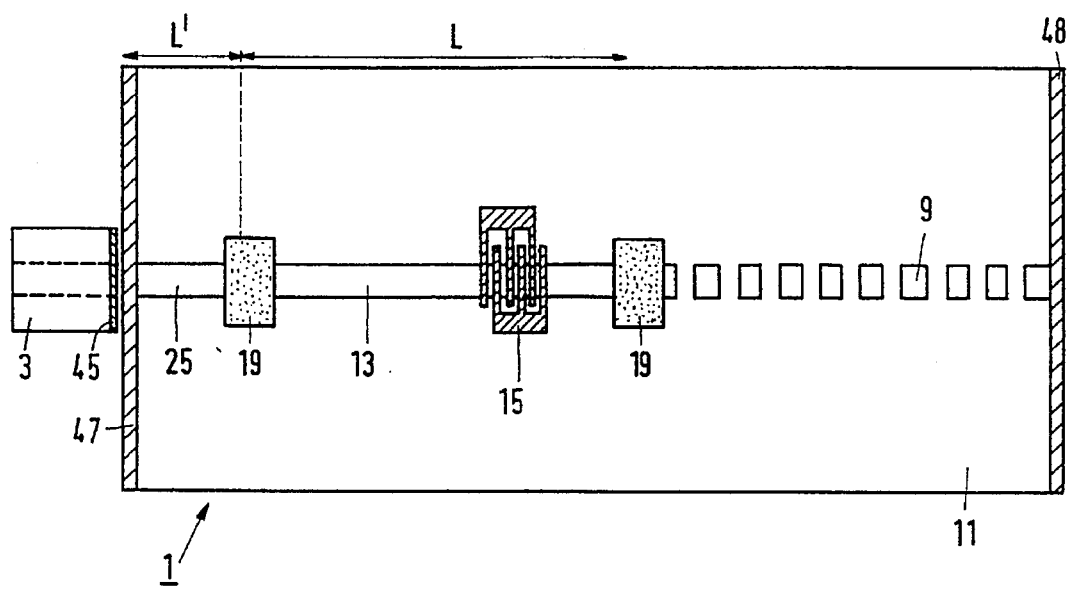

FIGS. 4 and 5 show modifications of the two embodiments according to FIGS. 2 and 3 in which a passive waveguide 25 having a length L' is arranged between the waveguide 13 of the stabilizer section 5 and the diode laser 3 so as to extend the resonant cavity of the diode laser 3. For L' it holds that $L' \gg \lambda_o^2/2n\Delta\lambda_{pm}$ in which $\lambda_o^2$ is the acceptance bandwidth of the non-linear optical material, n is the refractive index of the waveguide and $\lambda_o$ is the wavelength of the fundamental wave of the diode laser. As a result, the distance between the modi of the diode laser 3 is reduced considerably so that the possibility of a mode of the fundamental wave spectrum of the diode laser 3 tailing within the acceptance bandwidth of the non-linear optical material is increased considerably. A typical mode distance for a semiconductor laser of 250 µm length is approximately 4 Å. By extending the resonant cavity of the diode laser by L', a mode distance of less than 2 Å can be realised, i.e. smaller than the acceptance bandwidth of the frequency-doubling medium.

In FIG. 4, a bend 21 is provided between the waveguides 25 and 13 of length L' and L, respectively, and FIG. 5 shows an element 19 reflecting or absorbing the acoustic wave so as to prevent the acoustic wave propagating in the waveguide 25. In fact, this would result in a refractive index grating being induced in the passive waveguide 25 so that an unwanted grating reflection would occur.

Figure 6A:
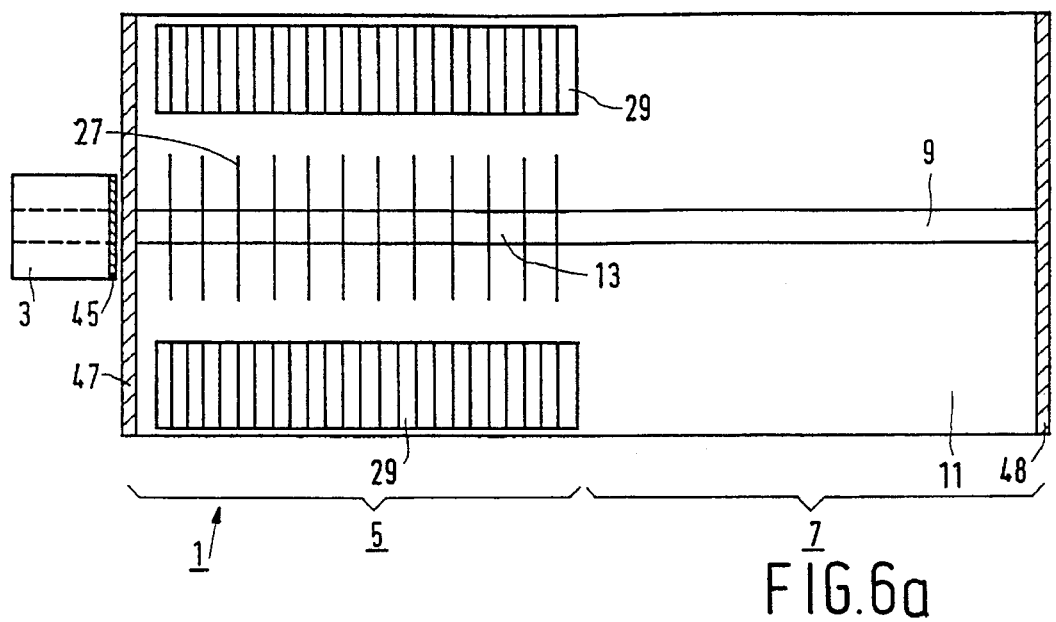
FIG. 6a is a plan view and FIGS. 6b and 7 are front elevational views of several embodiments of a device for raising the frequency according to the invention, in which the wavelength stabilization is realised in an electro-optical manner.
Figure 6B:
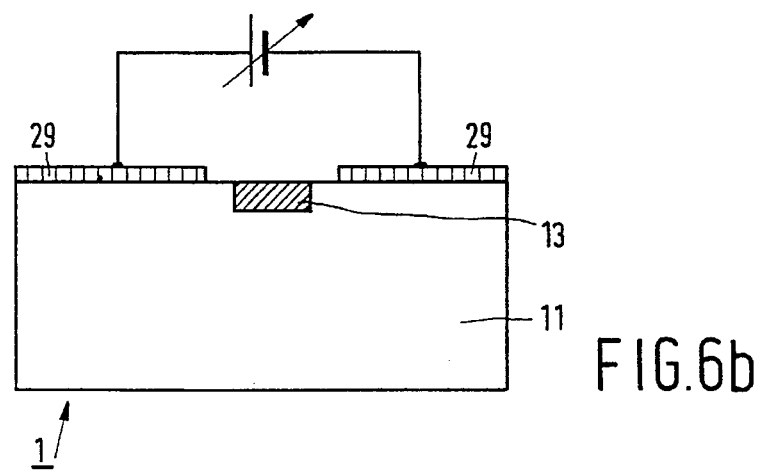
Figure 7:
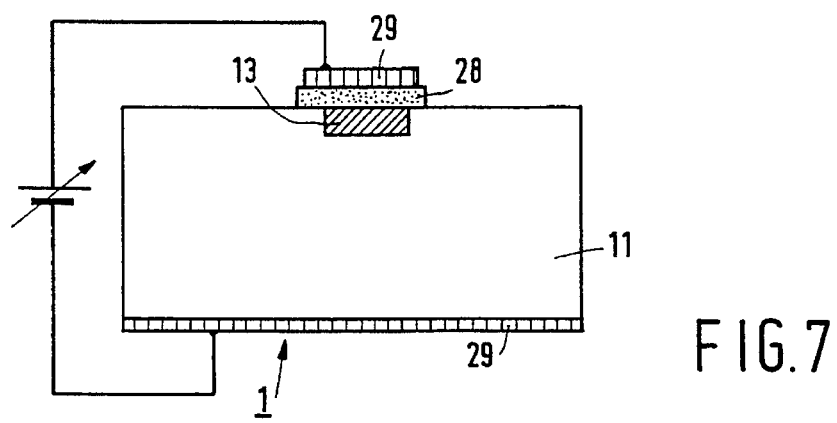

An alternative manner of realising a refractive index grating is shown in FIGS. 6a, 6b and 7 and consists in providing the non-linear optical material with a permanent periodical structure 27 which is subsequently enclosed between two electrically conducting electrodes 29 between which an electric field can be applied. Using the electro-optical effect, a variation of the applied voltage may vary the average refractive index of the waveguide 13 in which the periodical structure 27 is present and hence the value at which the wavelength of the fundamental wave of the diode laser 3 is stabilized. The periodical structure 27 may be provided, for example by etching in combination with lithographic techniques. In this way a relief grating is obtained. In the case or a waveguide obtained by ion exchange or indiffusion or outdiffusion at the surface of a crystal, the structure 27 is provided by means of a diffusion mask having a segmented channel structure.

FIGS. 6a and 6b show a plan view and a front elevational view, respectively, of a device according to the invention in which the stabilizer section 5 comprises a waveguide 13 with a refractive index grating which has a permanent periodical structure 22 in combination with electrodes 29. FIG. 6a shows an embodiment in which the non-linear optical material is cut along the optical z axis. Here, the electrodes 29 are parallel to the longitudinal direction of the waveguide at both sides of the waveguide 13. In this way the electric field along the optical z axis is directed along which the sensitivity is greatest.

FIG. 7 is a front elevational view of an embodiment in which the non-linear optical material is cut perpendicularly to the optical z axis. In order that the electric field is also directed along the z axis in this case, one electrode 29 is provided on top of the waveguide 13, while the other electrode 29 is provided at the lower side of the crystal 11. An optically transparent electric conductor 28 for preventing the optical attenuation due to the electrode 29 is arranged between the waveguide 13 and the electrode. This conductor 28 may be, for example a layer of indium oxide or tin oxide or a mixed oxide of both materials. Such a layer may also be provided in the embodiments shown in FIGS. 6a and 6b. When a thin electrode, i.e. of the order of 1 nm is used, the conductor 28 can be dispensed with.

Since both the wavelength of the diode laser and the location of the acceptance band of the non-linear optical material are highly temperature-sensitive, it is possible to compensate for temperature variations by varying the selection wavelength of the refractive index grating so that the fundamental wavelength will be outside the acceptance band. For example, to this end the intensity of the second harmonic radiation generated by the device is measured on the exit face of the waveguide 9 by means of a detector 12 as is illustrated in FIG. 1. Via the feedback circuit 14 the frequency of the acoustic wave or the strength of the electric field applied between the electrodes 29 can then be adjusted at the maximum value of this measured intensity. Thus it is ensured that the stabilized single mode wavelength of the diode laser is within the acceptance band of the frequency doubler by means of the stabilizer.

FIGS. 1 to 7 show the optical waveguide 13 functioning as a stabilizer as the waveguide in which the diode laser radiation is radiated. However, the sequence in which the stabilizer section 5 and the frequency-doubling section 7 succeed each other is not important for the invention and consequently the frequency-doubling section 7 may comprise the waveguide in which the diode laser radiation is radiated.

Figure 8:
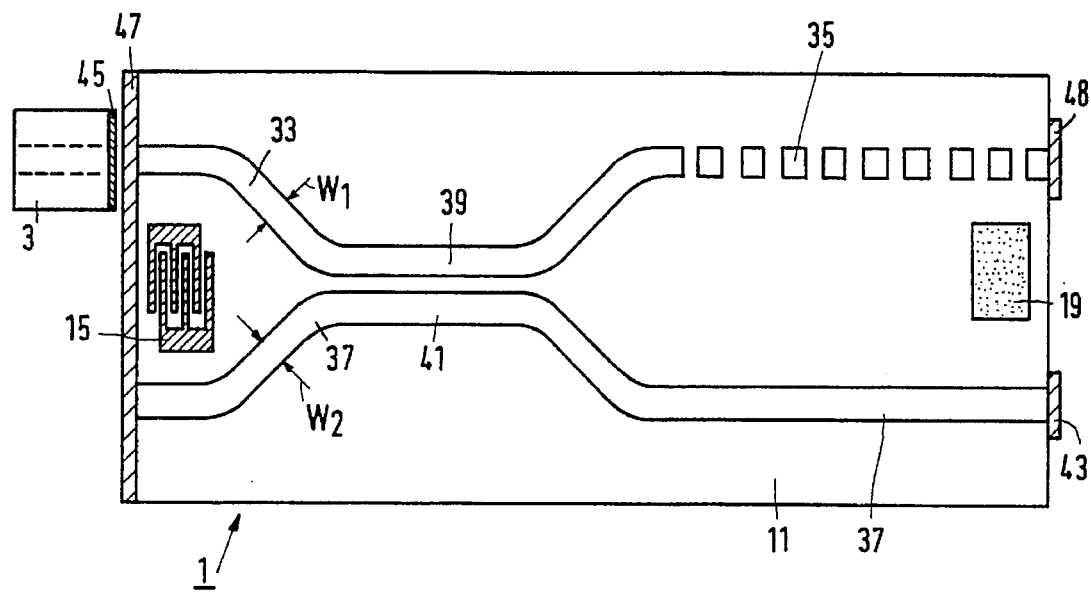
FIGS. 8 and 9 are plan views of several embodiments of a device for raising the frequency according to the invention, in which the refractive index grating is induced by a surface-acoustic wave performing a forward coupling.
Figure 9:
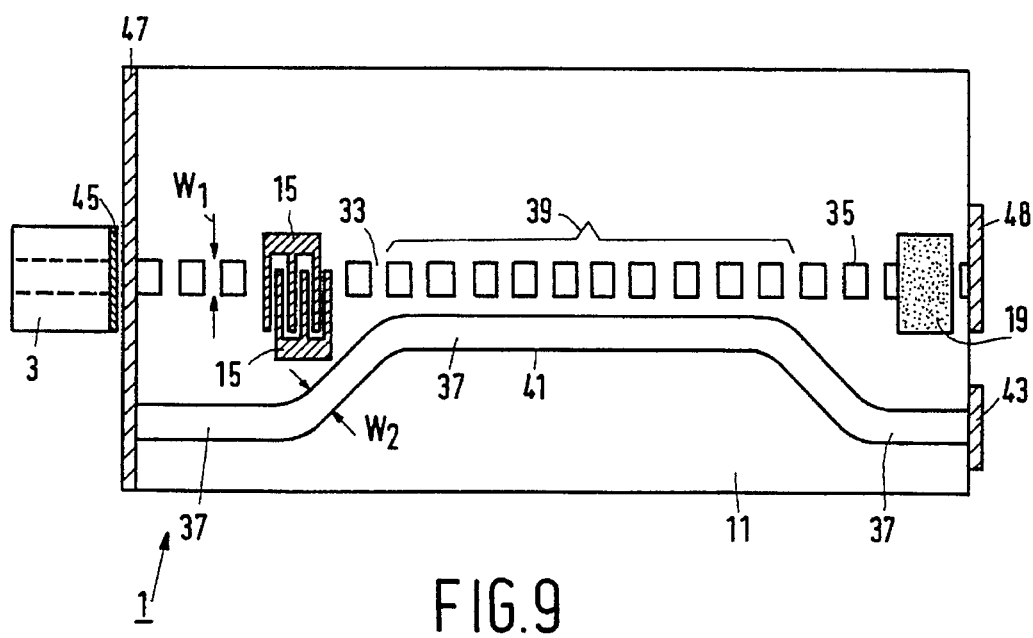

In the embodiments described so far, in which the refractive index grating is induced by means of an acoustic wave, the acoustic wave should have a relatively high frequency, for example several GHz. Such a high-frequency wave may be subject to attenuation. Moreover, for obtaining the high-frequency acoustic wave it will be necessary to use the higher tones of the transducer resonance, which is accompanied by a lower electric-acoustic version than in the case where the fundamental tone of the transducer resonance can be used. The reason of said drawbacks of a high-frequency acoustic wave is that a relatively large difference in propagation constant should be bridged between the radiation emitted by the diode laser and the radiation returning to the diode laser from the waveguide 13. In the embodiments of FIGS. 8 and 9 the wave, a portion of which is transferred from one waveguide to the other waveguide and the transferred wave, which will later return to the diode laser, propagate in the same direction as will be further described herein below. This means that only a small difference in propagation constant is to be bridged. The difference in propagation constant is given by $\Delta k = 2\pi n/\Lambda$ from which it appears that for a small $\Delta k$ a large pitch $\Lambda$ of the refractive index grating is sufficient. This corresponds to a low frequency of the acoustic wave.

In FIG. 8 the fundamental wave coming from the diode laser 3 is introduced into the waveguide 33. This waveguide 33 comprises a frequency-doubling section 35. Moreover the same non-linear optical material 11 comprises a second waveguide 37. Both waveguides 33 and 37 comprise a section 39 and 41, respectively, which run parallel and are located so close together that radiation can be transferred from one waveguide to the other waveguide. The area in which the sections 39 and 41 extend is the coupling area. The fundamental wave will consequently be transferred partly at the location of the coupling area, on the condition that the refractive index of the non-linear optical material allows the transfer between these two waveguide sections 39 and 41. To this end, a periodical refractive index variation is provided at the location of the coupling area 39, 41 by generating an acoustic wave by means of the transducer 15. The transducer 15 is positioned in such a way that the acoustic wave covers the coupling area 39, 41. The frequency of the acoustic wave determines the wavelength at which transfer will occur between the two waveguide sections 39 and 41. By varying the frequency of the acoustic wave, the wavelength at which transfer is desired can be chosen. At the end of the waveguide 37 there is a reflecting element 43 which reflects the wave propagating in the waveguide 37 at the wavelength selected by the acoustic wave to the coupling area 39, 41. Since the frequency of the acoustic wave allows transfer at this wavelength, this wave is partly transferred into the conductor 39 at this coupling area so as to subsequently propagate towards the diode laser 3 and ensure stabilization of the fundamental wave emitted by the diode laser at the wavelength for which the coupling is realised.

It is to be noted that the first and second waveguides 33, 37 have different widths $w_1$ and $w_2$. In that case there is generally no transfer of radiation between the two waveguides without taking further measures. The transfer of radiation is not made possible until a surface-acoustic wave of suitable frequency is induced in the coupling area. In the case of equal widths, a coupling would already occur between the two waveguides without the presence of a surface-acoustic wave, so that the coupling would not result in a wavelength selection.

FIG. 9 shows another embodiment of a device according to the invention, using a directional coupler. In this case the section 39 of the waveguide 33 located in the coupling area forms part of the frequency-doubling section 35. The transfer to the waveguide section 41 now takes place from the frequency-doubling segmented waveguide 35. An advantage of this embodiment is that the device 1 can be made shorter. The extent of coupling is also determined by the periodical structure of the frequency-doubling section 35.

In all embodiments described so far, the diode laser 3 may be coupled to the entrance face of the subsequent waveguide by means of an optical system or, as is shown in the Figures, by means of a butt coupling.

The exit face of the diode laser 3 is preferably provided with an anti-reflection coating 45 so as to prevent laser action at its own modi in the diode laser instead of at externally imposed modi. Moreover, the entrance face of the waveguide 13 may also be provided with an anti-reflection coating 47 so as to prevent unwanted reflections on the diode laser mirror and to promote a satisfactory coupling. To avoid troublesome reflections on the exit face of the waveguide 9, an anti-reflecting coating 48 may also be provided on this exit face.

Figure 10E:
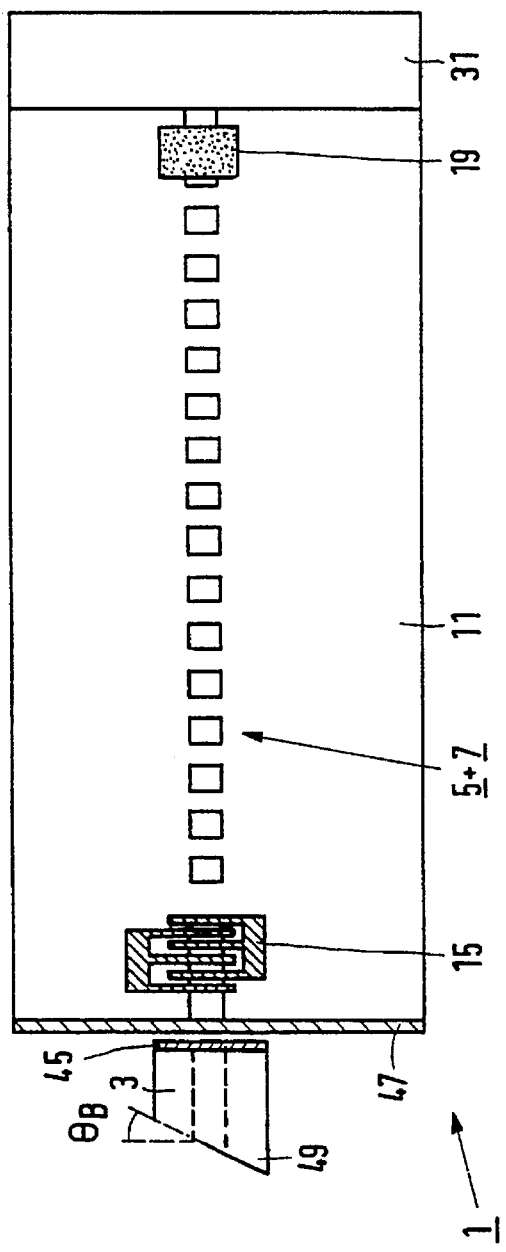

The frequency-doubling section 7 and the stabilizer section 5 may be implemented in one and the same waveguide instead of as waveguides adjoining each other in one and the same waveguiding structure as is shown in FIGS. 1 to 7. Here again it is sufficient to use an acoustic wave of low frequency. An embodiment in which the stabilizer 5 and the frequency doubler 7 are combined in one and the same segmented channel waveguide is shown in FIGS. 10a to 10f. The device 1 can thus be given a considerably more compact structure. The stabilizer section 5 has the shape of a channel waveguide which can be realised in the manners already mentioned. The surface-acoustic wave generated by means of the transducer 15 is radiated into the thus realised frequency-doubling section 7 in the manner described above. The diode laser 3 is arranged in front of the waveguide in such a way that predominantly radiation having a given linear polarization mode, for example the TM mode in accordance with the definition of the waveguide is emitted. The presented acoustic wave ensures that there is a coupling of the fundamental or higher-order polarization mode (TM mode in this case) to the fundamental or higher order perpendicular linear polarization mode (TE mode in this case). The polarization mode (TE) thus obtained propagates to the end of the waveguide where it is reflected on a reflector 31 which reflects the polarization mode not suitable for frequency doubling. The mode perpendicularly polarized thereon is passed. Such a reflector 31 may be, for example an externally provided reflector. However, the exit face of the waveguide 13 is preferably ground at a Brewster angle with respect to the normal on the surface of the device 1, for example $\theta_b \approx 28°$ for KTP so that the TE mode is to be reflected. For a non-linear optical material for which the TE mode is the suitable mode for frequency doubling and for which the TM mode is thus to be reflected, the exit face of the waveguide 13 can be ground at a Brewster angle $\theta_B$ with respect to the normal on the side face of the device 1. The reflected polarization mode (TE) is converted upon propagation in the direction of the diode laser 3 into a mode (TM) which is perpendicularly polarized thereon due to the presence of the acoustic wave. By feeding back this wave into the diode laser, it is ensured that the laser will operate at the mode (TM) which is suitable for frequency doubling. Because of the combination with the reflector 31, the acoustic wave thus produces a wavelength stabilization. FIG. 10b shows a side elevation of this embodiment. The element 19 reflecting or absorbing the acoustic wave can be provided for the case where a travelling wave instead of a standing acoustic wave is desired.

Figure 10F:
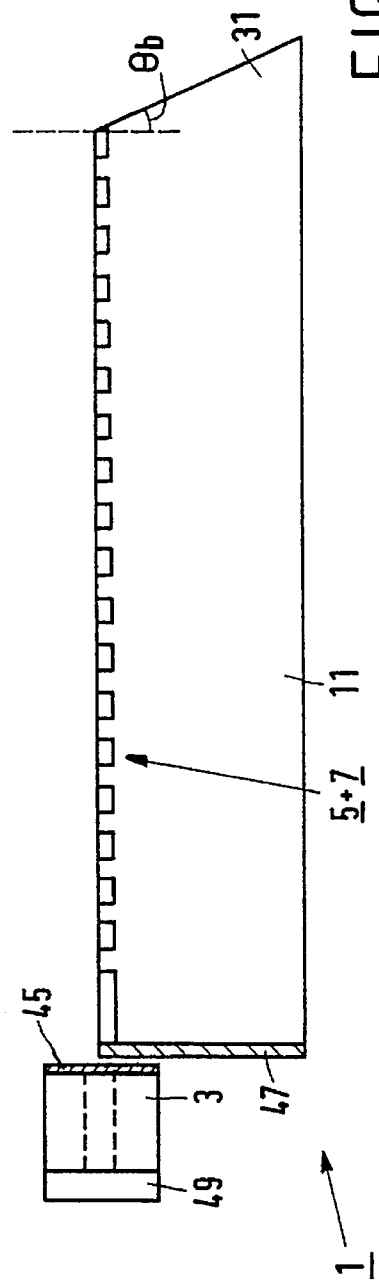

To prevent radiation emitted by the diode laser in the mode (TE for KTP) not suitable for frequency doubling from affecting the laser action, polarization means must be provided which eliminate this mode from the radiation emitted by the diode laser. In fact, the radiation emitted by the diode laser will generally also emit a small amount of radiation in this mode. This part of the radiation will not be influenced by the acoustic wave and will thus be passed unobstructed to the reflector 31. Consequently, the mode which is not suitable for frequency doubling is reflected towards the diode laser and coupled into the diode laser so that the diode laser will also partly operate in this mode again. The elimination of the mode not suitable for frequency doubling from the diode laser radiation can be realised, for example by providing a linear polarizer (not shown) between the diode laser and the waveguide. However, in this case the coupling can no longer be implemented as a butt coupling but by means of an optical system. Another possibility is to provide the diode laser 3 with a separate element 49 which selects the polarization mode suitable for frequency doubling (TM mode for KTP) and eliminates the other mode (TE) from the radiation. This embodiment is shown in FIGS. 10c and 10d. Moreover, the rear mirror of the diode laser 3 should also be provided with an anti-reflecting coating 51 in order to prevent reflection of the unwanted mode (TE in the case of KTP) on this rear mirror. If a TM-selective element is used, i.e. an element selecting the TM mode and eliminating the TE mode, the element 49 is preferably implemented as a rear mirror ground with respect to the original rear mirror at a Brewster angle, for example $\theta_b \approx 12°$ of the diode laser. A plan view and a side elevation of this embodiment are shown in FIGS. 10e and 10f. In the case of a laser mirror ground at a Brewster angle, a butt coupling can be used.

Such a polarization mode selection in the radiation emitted by the diode laser 3 can also be performed in the embodiments shown in FIGS. 1 to 9.

Also in the embodiments of FIGS. 6 to 10 a passive waveguide 25 having a length L' can be provided between the diode laser 3 and the stabilizer 5 so as to extend the resonance cavity of the diode laser in order to reduce the mode distance between the modi of the diode laser.

Figure 11:
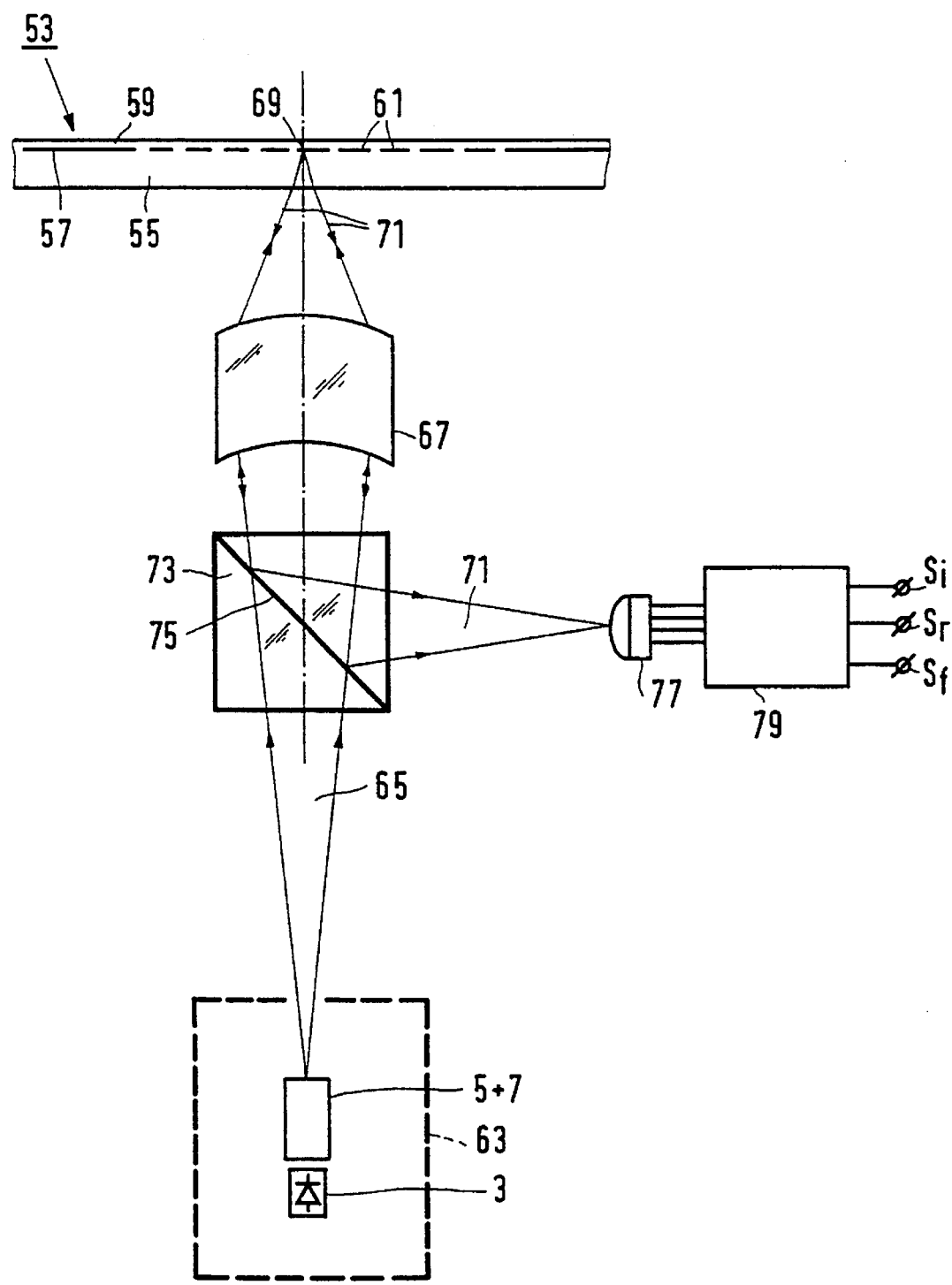
FIG. 11 illustrates an optical scanning device in accordance with one embodiment of the present invention.

FIG. 11 shows diagrammatically a device for optically scanning an information layer of an optical record carrier 53. Scanning is understood to mean scanning for the purpose of writing and scanning for the purpose of reading information.

The information layer may be an inscribed layer or a layer which may be completely or partly filled with information. The record carrier 53, a portion of which is shown in a radial cross-section in FIG. 11, comprises a transparent substrate 55, a reflecting information layer 57 and a coating 59. The information layer is divided into a large number of tracks 61 in which information is provided or can be written in the form of information areas (not shown) which are optically distinguished from their surroundings.

The scanning device comprises a radiation source unit 63 which supplies a beam 65 having such an aperture angle that it optimally fills an objective system 67 so that this system forms a diffraction-limited radiation spot 69 on the information layer. This layer reflects the radiation in a beam 71 which passes through the objective system again. To separate the beam 71 spatially from the beam 65, a partially reflecting element is provided, for example a prism 73 having a partially transparent face 75 which reflects a part of the beam 71 towards a detector 77. An information track can be scanned by rotating the record carrier. All information tracks can be scanned by moving the record carrier and the scanning spot 69 in a radial direction with respect to each other.

During reading, the reflected beam is modulated in intensity in conformity with the information stored in the succession of information areas. This modulation is converted into an electric signal by the detector 77. The detector is generally composed of a plurality of detector elements, so that it supplies a plurality of output signals which are processed in a signal processing circuit 79 to an information signal $S_i$ and a tracking error signal $S_r$ and a focus error signal $S_f$ for a tracking servosystem and a focus servosystem.

For further details on the reading apparatus reference is made to the article "Het Systeem "Compact Disc Digital Audio"" by M. G. Carasso, J. B. H. Peek and J. P. Sinjou in Philips Technisch Tijdschrift 40, pp. 267–272, 1981–82, no. 9.

According to the invention, the radiation source unit 63 is a device for raising the frequency as described above with reference to FIGS. 1 to 10.

The device for raising the frequency is very suitable for a writing device with which, for example in an ablative manner information can be written by surface deformation or by way of a magneto-optical process. During writing the beam 65 is modulated, for example by means of an acousto-optic modulator or by modulating the electric current through the diode laser.

In the case of a device for frequency doubling, this device supplies a scanning beam having a wavelength which is only half that of the radiation sources conventionally used for this purpose. Since the size of the scanning spot is proportional to the wavelength of the scanning beam, a scanning spot whose size is only half that of the scanning spot in a conventional device is formed in the new device. Consequently, smaller information areas can be read with the new device so that this device is capable of reading record carriers having an information density which is, for example four times the customary information density.

FIG. 11 only illustrates the principle of an optical scanning device with reference to one embodiment. There are numerous embodiments of this scanning device, and the device for raising the frequency according to the invention can be used in each of them. A special embodiment comprises a Laser Diffraction Grating Unit (LDGU). This is a very compact unit in which a diode laser, a multiple detector and one or two gratings are integrated, which unit is described in U.S. Pat. No. 4,924,079.

One of the gratings of the LDGU is used for deflecting the scanning beam radiation reflected by the record carrier and having passed the objective system for the second time from the path of the on-going scanning beam and to the composite detector. The deflection angle of the grating is dependent on the wavelength of the scanning beam. Since the focus error signal and the tracking error signal are derived from the intensity distribution across the composite detector, special steps have to be taken as described in said United States Patent so as to prevent said error signals from being influenced by a variation of the wavelength. By providing the very compact device for frequency doubling according to the invention as radiation source unit 63 in the LDGU, instead of a conventional diode laser, not only the advantage of the small scanning spot but also the additional advantage of stabilization of the wavelength of the scanning beam is obtained. Said measures then no longer need to be taken so that great freedom of design for the LDGU is created and, for example possibilities of generating the servosignal which have hitherto been less attractive, such as the astigmatic focus error detection method which is described in said United States Patent, will become attractive indeed.

The device described above can be used to great advantage in optical scanning devices, both in a scanning optical microscope or in a device for reading and/or writing a tape-shaped or disc-shaped record carrier such as a CD.

We claim:

1. A device for raising the frequency of electromagnetic radiation, comprising a diode laser for generating the radiation, a non-linear optical medium having a first optical waveguide for guiding a fundamental wave of the diode laser radiation while forming a second harmonic wave, and a wavelength stabilizer for stabilizing the wavelength of the fundamental wave, characterized in that the wavelength stabilizer is constituted by a second optical waveguide in a medium comprising a refractive index grating which extends in the longitudinal direction of the second optical waveguide, and an electrode structure by means of which the selection wavelength of the refractive index grating is electrically controllable.

2. The device as claimed in claim 1, characterized in that the waveguides in which the frequency is raised and in which the wavelength is stabilized are integrated in the same non-linear optical medium.

3. The device as claimed in claim 1, characterized in that the electrode structure forms part of an electro-acoustic converter for generating a surface-acoustic wave in the second optical waveguide by means of which a refractive index grating having a variable period can be induced.

4. The device as claimed in claim 3, characterized in that the non-linear optical medium is a KTP crystal.

5. An optical scanning device provided with a device for raising the frequency, an objective system for focusing a scanning beam supplied by the device to a scanning spot on a surface to be scanned, and a detection system for converting scanning radiation coming from the surface to be scanned into electric signals, characterized in that the device for raising the frequency is a device as claimed in claim 3.

6. The device as claimed in claim 3, characterized in that the first optical waveguide and the second optical waveguide are in alignment with each other, while for the refractive index grating induced by means of an acoustic wave, means are provided between the two waveguides, which means prevent propagation of the acoustic wave in the waveguide in which the frequency is raised.

7. The device as claimed in claim 6, characterized in that the means is a bend formed between the two waveguides.

8. The device as claimed in claim 6, characterized in that the means is an element reflecting or absorbing the acoustic wave.

9. The device as claimed in claim 3, characterized in that the first optical waveguide and the second optical waveguide are juxtaposed in the same non-linear optical medium and have different widths, each of the two waveguides having a section in a coupling area where the acoustic wave can be induced, said sections being located so close together that propagating radiation in the waveguides in the coupling area can be transferred between these two sections at a given frequency of the acoustic wave, while the diode laser is coupled in at the entrance face of the first waveguide and a reflecting element is present at the exit face of the second waveguide.

10. The device as claimed in claim 9, characterized in that the first waveguide constitutes the frequency-raising section.

11. The device as claimed in claim 3, characterized in that the refractive index grating is constituted by a relief grating and in that the electrode structure comprises two facing electrically conducting electrodes which enclose the relief grating and between which an electric field can be applied.

12. The device as claimed in claim 3, characterized in that the refractive index grating is a segmented channel structure and in that the electrode structure comprises two facing electrically conducting electrodes which enclose the channel structure and between which an electric field can be applied.

13. The device as claimed in claim 3, characterized in that the first optical waveguide and the second optical waveguide are in alignment with each other, while for the refractive index grating induced by means of an acoustic wave, means are provided between the two waveguides, which means prevent propagation of the acoustic wave in the waveguide in which the frequency is raised.

14. The device as claimed in claim 13, characterized in that the means is a bend formed between the two waveguides.

15. The device as claimed in claim 13, characterized in that the means is an element reflecting or absorbing the acoustic wave.

16. The device as claimed in claim 3, characterized in that the first optical waveguide and the second optical waveguide are juxtaposed in the same non-linear optical medium and have different widths, each of the two waveguides having a section in a coupling area where the acoustic wave can be induced, said sections being located so close together that propagating radiation in the waveguides in the coupling area can be transferred between these two sections at a given frequency of the acoustic wave, while the diode laser is coupled in at the entrance face of the first waveguide and a reflecting element is present at the exit face of the second waveguide.

17. The device as claimed in claim 16, characterized in that the first waveguide constitutes the frequency-raising section.

18. The device as claimed in claim 3, characterized in that the first waveguide and the second waveguide at least partly coincide, the exit face of the optical waveguide facing away from the diode laser being provided with an at least partial reflector which reflects the linear polarization mode-perpendicular to the linear polarization mode suitable for frequency doubling towards the diode laser and passes the polarization mode suitable for frequency doubling.

19. The device as claimed in claim 18, characterized in that the reflecting element is implemented as an exit face ground at a Brewster angle of the waveguide facing away from the diode laser.

20. The device as claimed in claim 3, characterized in that polarization means are provided between the diode laser and the subsequent waveguide, which means substantially only pass the linear polarization mode, suitable for frequency doubling, of the radiation emitted by the diode laser.

21. The device as claimed in claim 3, characterized in that an extra waveguide having a length L' is arranged between the diode laser and the wavelength stabilizer, where $L'>>\lambda_o^2/2n\Delta\lambda_{pm}$, with $\Delta\lambda_{pm}$ being the acceptance bandwidth for raising the frequency, n being the refractive index of the extra waveguide and $\lambda_o$ being the wavelength of the fundamental wave of the diode laser.

22. The device as claimed in claim 3, characterized in that the exit face of the diode laser has an anti-reflecting coating.

23. The device as claimed in claim 3, characterized in that the entrance face of the first waveguide has an anti-reflecting coating when the first waveguide is coupled to the laser diode, further characterized in that the entrance face of the second waveguide has an anti-reflecting coating when the second waveguide is coupled to the laser diode.

24. The device as claimed in claim 3, characterized in that the exit face of the second waveguide has an anti-reflecting coating when the second waveguide is spaced from the laser diode by the first waveguide, further characterized in that the exit face of the first waveguide has an anti-reflecting coating when the first waveguide is spaced from the laser diode by the second waveguide.

25. The device as claimed in claim 1, characterized in that the refractive index grating is constituted by a relief grating and in that the electrode structure comprises two facing electrically conducting electrodes which enclose the relief grating and between which an electric field can be applied.

26. The device as claimed in claim 1, characterized in that the refractive index grating is a segmented channel structure and in that the electrode structure comprises two facing electrically conducting electrodes which enclose the channel structure and between which an electric field can be applied.

27. The device as claimed in claim 1, characterized in that the first waveguide and the second waveguide at least partly coincide, the exit face of the optical waveguide facing away from the diode laser being provided with an at least partial reflector which reflects the linear polarization mode perpendicular to the linear polarization mode suitable for frequency doubling towards the diode laser and passes the polarization mode suitable for frequency doubling.

28. The device as claimed in claim 27, characterized in that the reflecting element is implemented as an exit face ground at a Brewster angle of the waveguide facing away from the diode laser.

29. The device as claimed in claim 1, characterized in that polarization means are provided between the diode laser and the subsequent waveguide, which means substantially only pass the linear polarization mode, suitable for frequency doubling, of the radiation emitted by the diode laser.

30. The device as claimed in claim 1, characterized in that an extra waveguide having a length L' is arranged between the diode laser and the wavelength stabilizer, where $L'>>\lambda_o^2/2n\Delta\lambda_{pm}$, with $\Delta\lambda_{pm}$ being the acceptance bandwidth for raising the frequency, n being the refractive index of the extra waveguide and $\lambda_o$ being the wavelength of the fundamental wave of the diode laser.

31. The device as claimed in claim 1, characterized in that the exit face of the diode laser has an anti-reflecting coating.

32. The device as claimed in claim 1, characterized in that the entrance face of the first waveguide has an anti-reflecting coating when the first waveguide is coupled to the laser diode, further characterized in that the entrance face of the second waveguide has an anti-reflecting coating when the second waveguide is coupled to the laser diode.

33. The device as claimed in claim 1, characterized in that the exit face of the second waveguide has an anti-reflecting coating when the second waveguide is spaced from the laser diode by the first waveguide, further characterized in that the exit face of the first waveguide has an anti-reflecting coating when the first waveguide is spaced from the laser diode by the second waveguide.

34. The device as claimed in claim 1, characterized in that the non-linear optical medium is a KTP crystal.

35. An optical scanning device provided with a device for raising the frequency, an objective system for focusing a scanning beam supplied by the device to a scanning spot on a surface to be scanned, and a detection system for converting scanning radiation coming from the surface to be scanned into electric signals, characterized in that the device for raising the frequency is a device as claimed in claim 1.

\* \* \* \* \*